United States Patent [19]
Kumar et al.

[11] Patent Number: 6,077,643
[45] Date of Patent: Jun. 20, 2000

[54] POLYMERS AND PHOTORESIST COMPOSITIONS

[75] Inventors: Uday Kumar, Natick; Charles R. Szmanda, Westborough; Roger F. Sinta, Woburn, all of Mass.; Leonard E. Bogan, Jr., Hatfield, Pa.

[73] Assignee: Shipley Company, L.L.C., Marlborough, Mass.

[21] Appl. No.: 08/919,768

[22] Filed: Aug. 28, 1997

[51] Int. Cl.[7] .................................................. G03F 7/039
[52] U.S. Cl. ...................................... 430/270.1; 430/170
[58] Field of Search ................................. 430/270.1, 170

[56] References Cited

U.S. PATENT DOCUMENTS

| | | | |
|---|---|---|---|
| 4,491,628 | 1/1985 | Ito et al. | 430/176 |
| 4,810,613 | 3/1989 | Osuch et al. | 430/192 |
| 4,883,740 | 11/1989 | Schwalm et al. | 430/270.1 |
| 4,968,581 | 11/1990 | Wu et al. | 430/192 |
| 5,075,199 | 12/1991 | Schwalm et al. | 430/281.1 |
| 5,230,984 | 7/1993 | Tachiki et al. | 430/270.1 |
| 5,399,647 | 3/1995 | Nozaki | 526/297 |
| 5,580,694 | 12/1996 | Allen et al. | 430/270.1 |
| 5,585,219 | 12/1996 | Kaimoto et al. | 430/270.1 |
| 5,607,824 | 3/1997 | Fahey et al. | 430/510 |
| 5,660,969 | 8/1997 | Kaimoto | 430/270.1 |
| 5,665,518 | 9/1997 | Maeda et al. | 430/270.1 |
| 5,688,628 | 11/1997 | Oie et al. | 430/176 |
| 5,693,691 | 12/1997 | Flaim et al. | 523/436 |
| 5,707,784 | 1/1998 | Oikawa et al. | 430/273.1 X |
| 5,861,231 | 1/1999 | Barclay et al. | 430/270.1 |
| 5,879,856 | 3/1999 | Thackeray et al. | 430/270.1 |
| 5,962,184 | 10/1999 | Allen et al. | 430/270.1 |

FOREIGN PATENT DOCUMENTS

| | | |
|---|---|---|
| 2001384 | 10/1989 | Canada . |
| 0 663 616 A2 | 7/1995 | European Pat. Off. . |
| 8-320559 | 12/1996 | Japan . |
| 9-160244 | 6/1997 | Japan . |

OTHER PUBLICATIONS

PTO 98–3498, English Translation of Noguchi et al, JP 05–320559 Issued Dec. 3, 1996, Patent and Trademark Office, FLS, Inc, 34 pages.

PTO 98–3497, English Translation of Suzuki et al, JP 09–160244 Issued Jun. 20, 1997, Patent and Trademark Office, USA, FLS, Inc, 30 pages.

Wallraff et al, "Single–Layer Chemically Amplified Photoresists for 193–nm Lithography", Journal of Vacuum Science and Technology B. Second Series, vol. 11, no. 6, Nov./Dec. 1993, pp. 2783–2788.

AN 074090, English Abstract of JP 08–320559, Online File WPIDS, Derwent Information, LTD, 1998.

Noguchi et al, 126:164293, English Abstract of JP 08320559, Online Chemical Abstracts, American Chemical Society, 1998.

Suzuki et al, 127:128715, English Abstract of JP 09–160244, Online Chemical Abstracts, American Chemical Society, 1998.

RN 186545–73–3, Online Registry File, American Chemical Society, two pages, 1998.

RN 192802–38–3, Online Registry File, American Chemical Society, 2 pages, 1998.

*Primary Examiner*—Cynthia Hamilton
*Attorney, Agent, or Firm*—Peter F. Corless; Darryl P. Frickey; S. Matthew Cairns

[57] ABSTRACT

The present invention provides novel polymers and chemically-amplified positive-acting photoresist compositions that contain such polymers as a resin binder component. The polymers of the invention include acid labile groups that contain isobornyl moieties and groups that contribute to aqueous development of a photoresist such as phenolic groups.

6 Claims, No Drawings

POLYMERS AND PHOTORESIST COMPOSITIONS

BACKGROUND OF THE INVENTION

1. Field of the Invention

The present invention relates to new polymers and use of such polymers as a resin binder component for photoresist compositions, particularly chemically amplified positive-acting resists.

2. Background

Photoresists are photosensitive films used for transfer of images to a substrate. A coating layer of a photoresist is formed on a substrate and the photoresist layer is then exposed through a photomask to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or crosslink in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble.

In general, photoresist compositions comprise at least a resin binder component and a photoactive agent. Photoresist compositions are described in Deforest, *Photoresist Materials and Processes,* McGraw Hill Book Company, New York, ch. 2, 1975 and by Moreau, *Semiconductor Lithography, Principles, Practices and Materials,* Plenum Press, New York, ch. 2 and 4, both incorporated herein by reference for their teaching of photoresist compositions and methods of making and using the same.

More recently, "chemically-amplified" resists have become of increased interest, especially for formation of sub-micron images and other high performance applications. Such photoresists may be negative-acting or positive-acting and generally include many crosslinking events (in the case of a negative-acting resist) or deprotection reactions (in the case of a positive-acting resist) per unit of photogenerated acid. In the case of positive chemically resists, certain cationic photoinitiators have been used to induce cleavage of certain "blocking" groups pendant from a photoresist binder, or cleavage of certain groups that comprise a photoresist binder backbone. See, for example, U.S. Pat. Nos. 5,075,199; 4,968,581; 4,883,740; 4,810,613; and 4,491,628, and Canadian Patent Application 2,001,384. Upon cleavage of the blocking group through exposure of a coating layer of such a resist, a polar functional group is provided, e.g., carboxyl or imide, which results in different solubility characteristics in exposed and unexposed areas of the resist coating layer.

Also recently interest has increased in photoresists that can be photoimaged with deep U.V. radiation. Such photoresists offer the potential of forming images of smaller features than may be possible at longer wavelength exposures. As is recognized by those in the art, "deep U.V. radiation" refers to exposure radiation having a wavelength in the range of about 350 nm or less, more typically in the range of about 300 nm or less.

While currently available photoresists are suitable for many applications, current resists also can exhibit significant shortcomings, particularly in high performance applications such as formation of highly resolved sub-micron and sub-half micron features.

For example, problems can arise upon etching a bared substrate surface defined by a developed resist relief image. In particular, to etch aluminum, silicon oxide and other substrates rather stringent conditions are often employed. Chlorine and fluorine-based gas etchants are frequently used and extensive localized heating often occurs during the etching sequence. As a consequence, the patterned photoresist coating on the substrate can experience shrinkage or other degradation. Such degradation can reduce resolution of the feature etched into the substrate and even render the substrate unusable for its intended purpose.

It thus would be desirable to have new photoresist compositions, particularly resist compositions that can be imaged at deep UV wavelengths such as 248 nm and 193 nm. It would be further desirable to have such photoresist compositions that exhibit enhanced stability or resistance to etching environments.

SUMMARY OF THE INVENTION

The present invention provides novel polymers and photoresist compositions that comprise a photoactive component and such polymers as a resin binder component. Preferred photoresists of the invention are chemically-amplified positive resists that are imaged with deep UV wavelengths, including sub-250 nm and sub-200 nm wavelengths such as 248 nm and 193 nm.

Preferred polymers of the invention comprise 1) repeating units that contain an isobornyl groups and that are capable of undergoing a deprotection reaction in the presence of photogenerated acid, and 2) repeating units that contribute to aqueous developability of a photoresist containing the polymer as a resin binder component, particularly phenolic groups or other hydroxy-aromatic groups.

Preferred polymers of the invention are the reaction product of a phenolic monomer such as vinylphenol and an isobornyl monomer, particularly an acrylic monomer such as isobornyl methacrylate and isobornyl acrylate.

It has been found that copolymers of the invention used as photoresist resin binders can impart exceptional performance characteristics to a resist. See, for instance, the results set forth in Example 2, which follows.

Polymers of the invention may comprise other units in addition to units 1) and 2). For example, the invention includes terpolymers, tetrapolymers and other copolymers that contain other units in addition to units 1) and 2). Preferred additional units include groups that are essentially unreactive under typical lithographic processing of a photoresist containing the polymer as a resin binder component. Moreover, the additional units preferably also have a high carbon content, and preferably at least about 70 percent of the unit's total mass is carbon, and more preferably at least about 80 percent of the unit's total mass is carbon. Specifically preferred additional units include substituted or unsubstituted phenyl, naphthyl, acenaphthyl, anthracenyl, phenanthracenyl, benzyl, benzhydryl, etc. as well as substituted and unsubstituted alicyclic groups such as alicyclic groups having 5 to about 18 carbons, e.g. substituted or unsubstituted isobornyl, norbornyl, adamantyl, cyclohexyl, etc.

The invention also provides methods for forming relief images, including methods for forming a highly resolved relief image such as a pattern of lines where each line has essentially vertical sidewalls and a line width of about 0.40 microns or less, or even about 0.25 microns or less. The invention further provides articles of manufacture comprising substrates such as a microelectronic wafer or a liquid crystal display or other flat panel display substrate having coated thereon the photoresists and relief images of the invention. Other aspects of the invention are disclosed infra.

DETAILED DESCRIPTION OF THE INVENTION

Polymers of the invention in general comprise 1) at least one high carbon content unit repeating unit that is capable of undergoing a deprotection reaction in the presence of photogenerated acid, and 2) units that contribute to aqueous base development of a photoresist containing the polymer as a resin binder component, e.g. phenolic groups or other hydroxy-aromatic groups. Preferred polymers of the invention include repeating units x and y as set forth in the following Formula I:

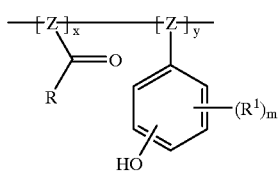

I wherein R is substituted or unsubstituted isobornyl;

each Z is an independent bridge group between polymer units, e.g. substituted or unsubstituted alkylene preferably having 1 to about 10 carbon atoms, more typically 1 to about 6 carbons, or more preferably 1 to about 3 carbons and optionally substituted by alkyl having 1 to about 3 carbons, or Z is a substituted or unsubstituted alkenyl or alkynyl, preferably having 2 to about 10 carbons and optionally substituted by alkyl having 1 to about 3 carbons;

each $R^1$ is independently halogen (particularly F, Cl and Br), substituted or unsubstituted alkyl preferably having 1 to about 12 carbons, substituted or unsubstituted alkoxy preferably having 1 to about 12 carbon atoms, substituted or unsubstituted alkenyl preferably having 2 to about 12 carbon atoms, substituted or unsubstituted alkynyl preferably having 2 to about 12 carbons, substituted or unsubstituted alkylthio preferably having 1 to about 12 carbons, cyano, nitro, amino, hydroxyl, etc., or two $R^1$ groups on adjacent carbons may be taken together to form (with ring carbons to which they are attached) one, two or more fused aromatic or alicyclic rings having from 4 to about 8 ring members per ring (such as to form with the depicted phenyl a substituted or unsubstituted naphthyl or acenaphthyl ring); m is an integer of from 0 (where each phenyl ring is fully hydrogen-substituted) to 4, and preferably is 0, 1 or 2; and x and y are mole fractions or percents of the respective units of the polymer. Preferably, x and y each will be within the range of from about 5 to 90 mole percent, and more typically y will be from about 40 to 95 mole percent.

Typically preferred are polymers that contain 1-isobornyl units, i.e. polymers of the following Formula II:

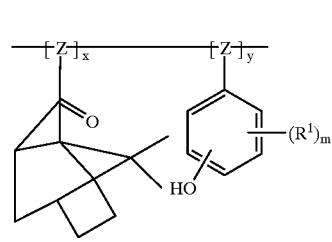

II wherein Z, $R^1$, x and y are the same as defined above for Formula I.

As discussed above, preferred polymers of the invention may include other repeating groups. For example, copolymers are provided that include, in addition to units 1) and 2), one or more units that are essentially unreactive under typical lithographic processing of a photoresist containing the polymer as a resin binder component, i.e. units that will be essentially non-reactive with acid or thermally (generally less than about 170° C.) under typical lithographic processing (pre-exposure treatment, exposure, post-exposure bake and development steps) of a photoresist containing the copolymer.

Preferred additional units may impart further etch resistance to the polymer and include substituted or unsubstituted phenyl, naphthyl, acenaphthyl, anthracenyl, phenanthracenyl, benzyl, benzhydryl moieties, etc. A particularly copolymer of the invention comprises a structure corresponding to the following Formula III:

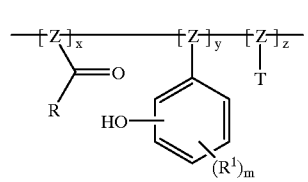

III wherein R, $R^1$ and m are the same as defined above for Formula I;

T is a group that preferably can impart further etch resistance to the polymer and may be e.g. substituted or unsubstituted aryl and aryalkyl such as substituted and unsubstituted phenyl, naphthyl, acenaphthyl, anthracenyl, phenanthracenyl, benzyl, benzhydryl, etc., or a substituted or unsubstituted alkyl, preferably having at least about 4 carbon atoms, more preferably at least about 6 carbons, or T may be an additional acid labile group such as an $C_{1-12}$ alkyl ester, e.g. —(C=O)OC(CH$_3$)$_3$ or an aryl ester or an acetate $C_{1-12}$ alkyl ester such as —CH$_2$(C=O)OC(CH$_3$)$_3$ or other suitable acid labile groups including those groups discussed in the above-mentioned patents and in U.S. Pat. No. 5,258,257 to Sinta et al.; and x, y and z are mole fractions or percents of the respective polymer units.

Alicyclic groups will be particularly suitable T groups such as substituted and unsubstituted adamantyl including 2-adamantylmethyl, norbornyl, isobornyl and the like. Substituted and unsubstituted phenyl also is a preferred T group.

In each of Formulae I through III, the depicted hydroxyl ring substituent may be either at the ortho, meta or para positions throughout the polymer. Para or meta substitution is generally preferred.

Preferred polymers of Formulae I through III include those where the only polymer units correspond to the general structures depicted in those Formulae, i.e. in the case of Formulae I and II where the sum of x and y is about 100 percent; and in the case of each of Formula III where the sum of x, y and z is about 100 percent.

However, preferred polymers also may comprise additional units wherein the sum of such mole fractions would be less than one hundred. For example, a polymer may comprise condensed substituted or unsubstituted styrene or other vinyl aryl units to provide pendant substituted or substituted phenyl or other aryl units. In Formulae I and II, preferably the sum of x and y will be at least about 50 percent, more preferably at least about 70 or 80 percent. In Formulae III, preferably the sum of x, y and z will be at least about 50 percent, more preferably at least about 70 or 80 percent.

Typically, a copolymer of the invention will contain at least about 2 to 3 mole percent of acid labile units 1), more typically at least 10 mole percent of such units.

In each of Formulae I, II and III, x is preferably from about 5 to 30 mole percent, more preferably from about 10 to 30 mole percent; y is preferably from about 50 to 95 mole percent, more preferably from about 50 to 90 mole percent; and z in Formulae III is suitably from about 2 to 50 mole percent, preferably 5 to about 40 mole percent.

In the above Formulae, Z bridge groups suitably will be substituted or unsubstituted alkylene preferably having 1 to about 10 carbon atoms, more typically 1 to about 6 carbons, or more preferably 1 to about 3 carbons and optionally substituted by alkyl having 1 to about 3 carbons, or Z is a substituted or unsubstituted alkenyl or alkynyl, preferably having 2 to about 10 carbons and optionally substituted by alkyl having 1 to about 3 carbons. Preferred Z groups include ethylene optionally substituted by $C_{1-3}$ alkyl such as methyl.

In all the above Formulae, it will be understood that alkyl, alkenyl and alkynyl each may be cyclic or straight or branched non-cyclic chains, unless otherwise specified. Exemplary cyclic groups include cyclohexyl, isobornyl, norbornyl, adamantyl and the like.

The above-mentioned substituted groups (i.e. substituted isobornyl, R, W, Z, $R^1$ or T groups) as well as other substituted groups discussed herein may be substituted at one or more available positions by one or more suitable groups such as halogen; hydroxyl; nitro; cyano; $C_{1-12}$ alkyl; $C_{1-12}$ alkoxy; $C_{2-12}$ alkenyl; $C_{2-12}$ alkynyl; aryl such as phenyl; alkanoyl such as $C_{1-12}$ alkanoyl e.g. acyl and the like; etc. Typically a substituted moiety is substituted at one, two or three available positions.

Specifically preferred T groups of the above Formula III include the following moieties as well as such moieties that are optionally substituted at available positions, e.g. by the above-mentioned substituents:

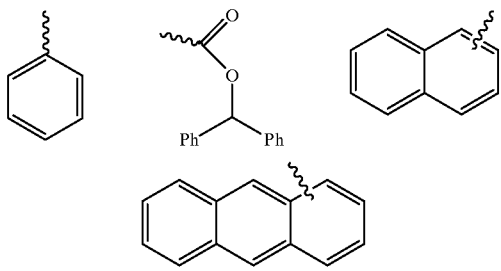

Polymers of the invention can be prepared by a variety of methods. One suitable method is free radical polymerization, e.g., by reaction of a plurality of monomers to provide the various units as discussed above in the presence of a radical initiator under an inert atmosphere (e.g., $N_2$ or argon) and at elevated temperatures such as about 50° C. or greater, although reaction temperatures may vary depending on the reactivity of the particular reagents employed and the boiling point of the reaction solvent (if a solvent is employed). For example, for synthesis of a phenolic polymer, vinyl phenol and an acid labile blocked monomer such as substituted and unsubstituted isobornyl methacrylates or isobornylacrylates can be polymerized under free radical conditions, e.g. in refluxing isoproponal in the presence of a free radical initiator such as 2,2'-azobisisobutyronitrile. Additional monomers (such as monomers containing high carbon content moieties or other acid labile groups such as t-butyl or other alkyl acrylate units) can be copolymerized to the desired polymer. Such other monomers include e.g. substituted and unsubstituted styrenes, diphenyl methylmethacrylates, 2-adamantylmethyl methacrylates, etc. as mentioned above.

To facilitate polymer synthesis, a monomer that contains a hydroxy or other reactive moiety may be reacted with the reactive moiety in "masked" form. For example, vinylphenylacetate may be employed as a "masked" form of hydroxystyrene. Other hydroxy masking or protecting groups also will be suitable such as alkylsilyl groups (to form silylethers with the hydroxy moiety), e.g. $(CH_3)_3Si$, $(CH_3)_2(butyl)Si-$, $((CH_3)_3C)3Si-$, etc.; other alkyl esters, e.g. $CH_3CH_2C(=O)-$, etc. After reaction completion, the masking groups may be removed under basic conditions. For example, the formed polymer may be heated in the presence of $NH_4OH$, $NH_4OAc$, ammonium sulfite, glycidyl amide or other suitable base.

Suitable reaction temperatures to conduct a free radical polymerization for any particular system can be readily determined empirically by those skilled in the art based on the present disclosure. A reaction solvent may be employed if desired. Suitable solvents include ketones such as acetone, alcohols such as propanols and butanols, aromatic solvents such as benzene, chlorobenzene, toluene and xylene, and ethers such as tetrahydrofuran. Dimethylsulfoxide and dimethylformamide are also suitable. The polymerization reaction also may be run neat. A variety of free radical initiators may be employed to prepare the polymers of the invention. For example, azo compounds may be employed such as 2,2'-azobis-2,4-dimethyl-pentanenitrile, 2,2'-azobisisobutyronitrile (AIBN) and 1,1'-azobis (cyclohexanecarbonitrile). Peroxides, peresters, peracids and persulfates also can be employed.

Preferably a polymer of the invention will have a weight average molecular weight ($M_w$) of 1,000 to about 100,000, more preferably about 2,000 to about 30,000 with a molecular weight distribution ($M_w/M_n$) of about 3 or less, more preferably a molecular weight distribution of about 2 or less. Molecular weights (either Mw or Mn) of the polymers of the invention are suitably determined by gel permeation chromatography.

As discussed above, polymers of the invention are highly useful as the resin binder component in photoresist compositions, particularly chemically-amplified positive resists. Photoresists of the invention in general comprise a photoactive component and a resin binder component that comprises the above-described copolymer.

The resin binder component should be used in an amount sufficient to render a coating layer of the resist developable with an aqueous alkaline developer.

The resist compositions of the invention also comprise a photoacid generator (i.e. "PAG") that is suitably employed in an amount sufficient to generate a latent image in a coating layer of the resist upon exposure to activating radiation. Generally, sulfonate compounds are preferred PAGs, particularly sulfonate salts. Two specifically preferred agents are the following PAGS 1 and 2:

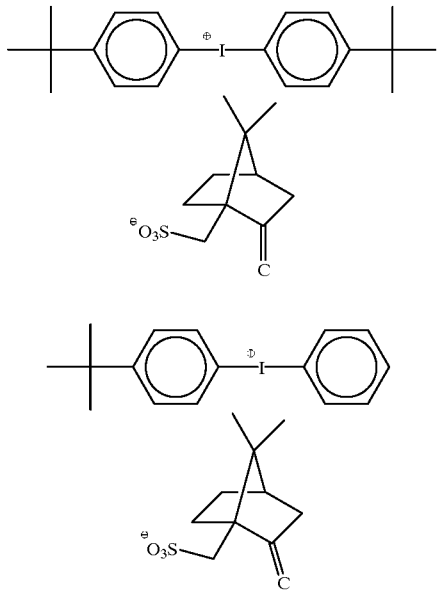

Such sulfonate compounds can be prepared as disclosed in European Patent Application 96118111.2 (publication number 0783136). Briefly, PAG 1 can be prepared by reaction of a mixture of potassium iodate, t-butylbenzene and acetic anhydride with sulfuric acid added dropwise to the mixture with ice-bath cooling. The reaction mixture is then stirred at room temperature for approximately 22 hours, water added with cooling to about 5–10° C. and then washing with hexane. The aqueous solution of diaryliodium hydrogensulfate is then cooled to 5–10° C. and then (+/−)-10-camphorsulfonic acid added followed by neutralization with ammonium hydroxide. Sulfonate PAG 2 above can be prepared by those same procedures, except approximately molar equivalents of t-butyl benzene and benzene would be reacted together in the first step with acetic anhydride and $KIO_3$.

Also preferred are the above two iodonium compounds complexed with other counter anions than the above-depicted camphorsulfonate groups. In particular, preferred counter anions include those of the formula $RSO_3^-$ where R is adamantane, alkyl (e.g. $C_{1-12}$ alkyl) and perfluoroalkyl such as perfluoro ($C_{1-12}$alkyl), particularly perfluoro counter anions of perfluorooctanesulfonate, perfluorononylsulfonate and the like.

Further preferred PAGS include imidosulfonates such as compounds of the following formula:

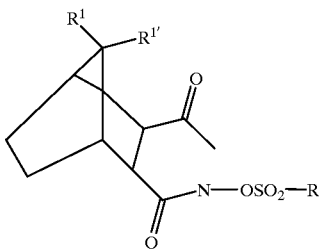

wherein each $R^1$ and $R^{1'}$ are each independently hydrogen or $C_{1-12}$ alkyl, more preferably hydrogen or methyl; and R is as defined above, i.e. camphor, adamantane, alkyl (e.g. $C_{1-12}$ alkyl) and perfluoroalkyl such as perfluoro($C_{1-12}$alkyl), particularly perfluoro counter anions of perfluorooctanesulfonate, perfluorononylsulfonate and the like.

Triphenylsulfonium salts are also preferred PAGS for use in the photoresists of the invention, including compounds of the following formula:

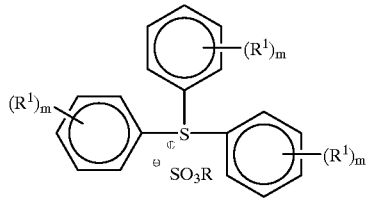

wherein each $R^1$ is independently hydrogen or $C_{1-12}$ alkyl; each m is independently an integer of from 0 to 5, and preferably each m is 0, 1 or 2; and R is as defined above, i.e. camphor, adamantane, alkyl (e.g. $C_{1-12}$ alkyl) and perfluoroalkyl such as perfluoro($C_{1-12}$alkyl), particularly perfluoro counter anions of perfluorooctanesulfonate, perfluorononylsulfonate and the like.

Other suitable sulfonate PAGS including sulfonated esters and sulfonyloxy ketones. See *J. of Photopolymer Science and Technology*, 4(3):337–340 (1991), for disclosure of suitable sulfonate PAGS, including benzoin tosylate, t-butylphenyl alpha-(p-toluenesulfonyloxy)-acetate and t-butyl alpha-(p-toluenesulfonyloxy)-acetate. Preferred sulfonate PAGs are also disclosed in U.S. Pat. No. 5,344,742 to Sinta et al.

Other useful acid generators include the family of nitrobenzyl esters, and the s-triazine derivatives. Other known PAGS also may be employed in the resists of the invention.

A preferred optional additive of resists of the invention is an added base, particularly tetrabutylammonium hydroxide (TBAH), or the lactate salt of TBAH, which can enhance resolution of a developed resist relief image. The added base is suitably used in relatively small amounts, e.g. about 0.1 to 5 percent by weight relative to the photoactive component (PAG).

Photoresists of the invention also may contain other optional materials. For example, other optional additives include anti-striation agents, plasticizers, speed enhancers, etc. Such optional additives typically will be present in minor concentrations in a photoresist composition except for fillers and dyes which may be present in relatively large concentrations, e.g., in amounts of from about 5 to 30 percent by weight of the total weight of a resist's dry components.

The compositions of the invention can be readily prepared by those skilled in the art. For example, a photoresist composition of the invention can be prepared by dissolving the components of the photoresist in a suitable solvent such as, for example, ethyl lactate, a glycol ether such as 2-methoxyethyl ether (diglyme), ethylene glycol monomethyl ether, ethylene glycol monomethyl ether, propylene glycol monomethyl ether; and 3-ethoxyethyl propionate. Typically, the solids content of the composition varies between about 5 and 35 percent by weight of the total weight of the photoresist composition. The resin binder and PAG components should be present in amounts sufficient to provide a film coating layer and formation of good quality latent and relief images. See the examples which follow for exemplary preferred amounts of resist components.

The compositions of the invention are used in accordance with generally known procedures. The liquid coating compositions of the invention are applied to a substrate such as by spinning, dipping, roller coating or other conventional coating technique. When spin coating, the solids content of the coating solution can be adjusted to provide a desired film thickness based upon the specific spinning equipment utilized, the viscosity of the solution, the speed of the spinner and the amount of time allowed for spinning.

The resist compositions of the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass or indium tin oxide coated (e.g. flat panel display applications) substrates and the like are also suitably employed.

Following coating of the photoresist onto a surface, it is dried by heating to remove the solvent until preferably the photoresist coating is tack free. Thereafter, it is imaged through a mask in conventional manner. The exposure is sufficient to effectively activate the photoactive component of the photoresist system to produce a patterned image in the resist coating layer and, more specifically, the exposure energy typically ranges from about 1 to 300 mJ/cm$^2$, dependent upon the exposure tool and the components of the photoresist composition.

Coating layers of the resist compositions of the invention are preferably photoactivated by an exposure wavelength in the deep U.V. range i.e., 350 nm or less, more typically in the range of about 300 nm or less, typically about 200 to 300 or 450 nm. A particularly preferred exposure wavelength is about 248 nm.

Following exposure, the film layer of the composition is preferably baked at temperatures ranging from about 70° C. to about 160° C. Thereafter, the film is developed. The exposed resist film is rendered positive working by employing a polar developer, preferably an aqueous based developer such as an inorganic alkali exemplified by sodium hydroxide, potassium hydroxide, sodium carbonate, sodium bicarbonate, sodium silicate, sodium metasilicate; quaternary ammonium hydroxide solutions such as a tetra-alkyl ammonium hydroxide solution; various amine solutions such as ethyl amine, n-propyl amine, diethyl amine, di-n-propyl amine, triethyl amine, or methyldiethyl amine; alcohol amines such as diethanol amine or triethanol amine; cyclic amines such as pyrrole, pyridine, etc. In general, development is in accordance with art recognized procedures.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, e.g., the manufacture of silicon dioxide wafers, suitable etchants include a gas etchant, e.g. a chlorine or fluorine-based etchant such a $CF_4$ or $CF_4/CHF_3$ etchant applied as a plasma stream. After such processing, resist may be removed from the processed substrate using known stripping procedures.

All documents mentioned herein are fully incorporated herein by reference. The following non-limiting examples are illustrative of the invention.

EXAMPLE 1

Polymer Synthesis

Copolymers of p-vinyl phenol/isobornyl methacrylate and p-vinyl phenol/isobornyl acrylate and terpolymers of p-vinyl phenol/isobornyl methacryate/styrene and p-vinyl phenol/isobornyl acrylate/styrene were prepared for evaluation in positive deep UV formulations. The resins were prepared by radical polymerization of p-acetoxy styrene with the appropriate monomers followed by in-situ deprotection of the acetoxy group as exemplified by the following synthesis of poly[p-vinyl phenol (85%)-co-isobornyl methacrylate (15%)] (Polymer 1).

Part 1

Preparation of poly[p-vinyl phenol (85%)-co-isobornyl methacrylate (15%)] (Polymer 1)

A solution of p-acetoxy styrene (90.80 g, 0.560 moles) and isobornyl methacrylate (21.95 g, 0.098 moles) in isopropanol was degassed by bubbling nitrogen through it. A solution of 2,2'-azobisisobutyronitrile (4.30 g, 0.026 moles) in 20 ml acetonitrile was then added and the resulting solution refluxed for 24 hours. A solution of ammonium acetate (86.3 g, 1.12 moles) in 70 ml water was then added to the reaction mixture and refluxed for another 18 hours. The reaction mixture was cooled, precipitated into water, filtered and slurried once with water. The resultant white polymer of poly[p-vinyl phenol (85%)-co-isobornyl methacrylate (15%)] (Polymer 1) was filtered and then dried in a vacuum oven for 24 hours.

Part 2

Preparation of poly[p-vinyl phenol (85%)-co-isobornyl acrylate (15%)] (Polymer 2)

Poly[p-vinyl phenol (85%)-co-isobornyl acrylate (15%)] (Polymer 2) was prepared by radical polymerization of p-acetoxy styrene (93.1 g, 0.574 moles) and isobornyl acrylate (21.1 g, 0.101 moles) by the above mentioned procedure per Polymer 1.

Part 3

Preparation of poly[p-vinyl phenol (73%)-co-isobornyl acrylate -(7%)-co-styrene (20%] (Polymer 3)

Poly[p-vinyl phenol (73%)-co-isobornyl acrylate -(7%)-co-styrene (20%] (Polymer 3) was prepared by the reaction of p-acetoxy styrene (90.5 g, 0.558 moles), isobornyl acrylate (11.14 g, 0.053 moles) and styrene (0.153 moles) similar to the method used for the synthesis of Polymer 1.

Part 4

Preparation of Polymers 4–7

Polymers 4–7 (each p-vinyl phenol/isobornyl acrylate copolymers) having the compositions specified in Table 1 below were prepared as generally described above for Polymer 1. Table 1 below specifies the structures of Polymers Nos. 1–7 with reference to the structural formula set forth immediately above the Table. Table 2 below specifies selected properties of Polymers Nos. 1–7.

TABLE 1

[Structural formula of copolymer with x, y, z repeat units: p-vinylphenol (OH), styrene, and isobornyl acrylate/methacrylate (R group)]

| Polymer Number | R | Vinylphenol content Mole frac. % (value of x) | Styrene content mole frac. % (value of y) | Isobornyl content mole frac. % (value of z) |
|---|---|---|---|---|
| 1 | $CH_3$ | 85 | 0 | 15 |
| 2 | $CH_3$ | 85 | 0 | 15 |
| 3 | $CH_3$ | 82 | 0 | 18 |
| 4 | H | 85 | 0 | 15 |
| 5 | H | 81 | 0 | 19 |
| 6 | H | 73 | 7 | 20 |
| 7 | H | 73 | 7 | 20 |

| Polymer Number | $T_g$ °C. | $T_d$ °C. | $M_w$ |
|---|---|---|---|
| 1 | 180 | 280 | 12000 |
| 2 | 181 | 280 | 9000 |
| 3 | 183 | 280 | 12000 |
| 4 | 168 | 270 | 13000 |
| 5 | 175 | 270 | 13000 |
| 6 | 164 | 272 | 11000 |
| 7 | 161 | 270 | 8500 |

In Table 2: $T_g$ = glass transition temperature; $T_d$ = thermal deblocking temperature of the isobornyl moiety; $M_w$ = weight average molecular weight.

EXAMPLE 2

Preparation and Lithographic Processing

Part 1: Photoresist A

A photoresist composition of the invention (designated "Photoresist A") was prepared by admixing the following components of the specified amounts:
Polymer No. 1=3.795 g
Triarylsulfonium trifluoromethylbenzenesulfonate=0.190 g
Silwet L7604=0.020 g
t-butylammonium hydroxide=0.015 g
ethyl lactate=20.980 g That Photoresist A was coated to an $E_{min}$ thickness of 7320 Å and exposed on a GCA XLS 7800 KrF Excimer Laser system. The processing conditions were as follows: soft bake 135° C./60 seconds, post exposure bake 135° C./90 seconds and developed for 45 seconds by 45 seconds single spray puddle build with LDD26W (0.26N surfactant containing developer).

| Lithographic Results: | |
|---|---|
| $E_o$ | 9.8 mj/cm$^2$ |
| $E_s$ | 23.5 mj/cm$^2$ dense; 18.6 mj/cm$^2$ isolated |
| Isolated line resolution | 130 nm |
| Nested line resolution | 240 nm |
| Focus latitude | |
| 250 dense | 0.4 microns |
| 250 isolated | 0.8 microns |
| Exposure latitude | |
| 250 nm dense | 12.0 % |
| 250 nm isolated | 15.7 % |

Part 2: Photoresist B

A second photoresist (designated "Photoresist B") was prepared as described above for Photoresist A except 3.795 g of Polymer 2 was used in place of Polymer 2. All the other components and amounts of Photoresist B were the same as Photoresist A. The exposure and wafer processing conditions for Photoresist B were the same as that used for Photoresist A.

| Lithographic results: | |
|---|---|
| $E_o$ | 9.3 mj/cm$^2$ |
| $E_s$ | 24.2 mj/cm$^2$ dense; 18.6 mj/cm$^2$ isolated |
| Isolated line resolution | 130 nm |
| Nested line resolution | 240 nm |
| Focus latitude | |
| 250 dense | 0.6 microns |
| 250 isolated | 1.2 microns |
| Exposure latitude | |
| 250 nm dense | N/A |
| 250 nm isolated | 10.0 % |

EXAMPLE 3

Further Photoresist Preparation and Processing

A photoresist composition of the invention was prepared by mixing the following components with amounts expressed as weight percents based on total weight of the resist composition.

| Resist Components | Amount (wt. %) |
|---|---|
| Resin Binder | 15 |
| Photoacid Generator | 4 |
| Ethyl Lactate | 81 |

The resin binder was a copolymer that contained 85 mole % 4-vinylphenol units and 15 mole % isobornyl methacrylate units and the photoacid generator was di-triphenylsulfonium perfluorooctancesulfonate.

The photoresist composition was spin coated onto HMDS vapor primed 4 inch bare silicon wafers and softbaked via a vacuum hotplate at 120° C. for 60 seconds. The resist coating layers were flood exposed at 248 nm at an exposure dose of 20 mJ/cm$^2$, and then separate silicon wafers were post-exposure baked (PEB) at selected temperatures ranging from 110–140° C. The wafers were treated with 0.26 N aqueous tetramethylammonium hydroxide solution. Dissolution rates varied with PEB temperatures and the following values were obtained: at a PEB temperature of 110° C., a dissolution rate of approximately 400 angstroms per second; at a PEB temperature of 120° C., a dissolution rate of approximately 750 angstroms per second; at a PEB temperature of 130° C., a dissolution rate of approximately 1300 angstroms per second; and at a PEB temperature of 140° C., a dissolution rate of approximately 1750 angstroms per second.

The foregoing description of the invention is merely illustrative thereof, and it is understood that variations and modification can be made without departing from the spirit or scope of the invention as set forth in the following claims.

What is claimed is:

1. An article of manufacture comprising a substrate that is a microelectronic wafer substrate or a flat panel display substrate, the substrate having coated thereon a photoresist composition comprising 1) a polymer that consists of a) repeating units that contain isobornyl units that are capable of undergoing a deprotection reaction in the presence of photogenerated acid, and b) repeating units that contain phenolic groups, 2) a photoacid generator ccompound in an amount sufficient to generate a latent image in a coating layer of the photoresist upon exposure to activating radiation.

2. An article of claim 1 wherein the polymer is an acrylate copolymer.

3. An article of claim 1 wherein the photoresist composition consists essentially of the polymer and the photoacid generator compound.

4. An article of claim 1 wherein the photoresist composition consists of the polymer and the photoacid generator compound.

5. The article of claim 1 wherein the substrate is a microelectronic wafer substrate.

6. The article of claim 1 wherein the substrate is a flat panel display substrate.

* * * * *